United States Patent [19]
Bagley

[11] Patent Number: 5,828,243
[45] Date of Patent: Oct. 27, 1998

[54] METHOD FOR DETECTING CLOCK FAILURE AND SWITCHING TO BACKUP CLOCK

[75] Inventor: Robert Craig Bagley, San Jose, Calif.

[73] Assignee: MTI Technology Corporation, Anaheim, Calif.

[21] Appl. No.: 740,105

[22] Filed: Oct. 28, 1996

[51] Int. Cl.[6] .................................................... G01R 19/00
[52] U.S. Cl. .............................. 327/99; 327/20; 327/144; 327/153
[58] Field of Search .................................. 327/3, 18, 20, 327/23, 24, 25, 26, 27, 99, 141, 142, 144, 152, 153

[56] References Cited

U.S. PATENT DOCUMENTS 5,561,390  10/1996  Hiiragizawa ................................ 327/20

OTHER PUBLICATIONS

"Clock-fail circuit switches to alternate clock", Rick Downs, EDN Oct. 24, 1996.
"Low Skew CMOS PLL Clock Driver", Motorola Semiconductor Technical Data, MC88915, Motorola BR1333—Timing Solutions.

Primary Examiner—Toan Tran
Assistant Examiner—Jeffrey Zweizig
Attorney, Agent, or Firm—Townsend and Townsend and Crew LLP

[57] ABSTRACT

A clock failure detection circuit which monitors a clock by comparing the clock to at least one delayed version of itself is provided. The original clock and the delayed version will be offset, such that an edge of one of them can clock a logic circuit to determine if the clock is at the proper level. By setting up the delay so that a clock edge is generated when the clock signal should be low, for instance, a bad output signal will be provided whenever the clock is high instead. This could be caused by the clock being stuck high, or by an irregular pulse width.

8 Claims, 4 Drawing Sheets

5,828,243

METHOD FOR DETECTING CLOCK FAILURE AND SWITCHING TO BACKUP CLOCK

BACKGROUND OF THE INVENTION

The present invention relates to clock monitoring circuits, and in particular a hardware implementation of a circuit for detecting clock failure and switching to a backup clock.

In many computer systems, there is a desire to provide a fail-safe mechanism and redundancy. One aspect that can fail on a computer system is the system clock. Such a failure might manifest itself by the clock producing irregular pulses, or by becoming stuck at a high or low level. It is important to quickly detect such a malfunction. In addition, it is important to be able to switch to a new clock without having glitches or missing pulses.

SUMMARY OF THE INVENTION

The present invention provides a clock failure detection circuit which monitors a clock by comparing the clock to at least one delayed version of itself. The original clock and the delayed version will be offset, such that an edge of one of them can clock a logic circuit to determine if the clock is at the proper level. By setting up the delay so that a clock edge is generated when the clock signal should be low, for instance, a bad output signal will be provided whenever the clock is high instead. This could be caused by the clock being stuck high, or by an irregular pulse width.

Preferably, a second delay signal or an inverted signal is used to provide a clock edge when the clock is supposed to be high. This enables the catching of the situation when the clock is stuck low as well.

The output of the logic circuit is provided to a switching circuit which switches to an auxiliary clock when a clock malfunction is detected. In one embodiment, the switching is done using a phase lock loop to ensure that the switching itself will not generate any glitches or missing pulses.

For a fuller understanding of the nature and advantages of the invention, reference should be made to the ensuing detailed description taken in conjunction with the accompanying drawings.

DETAILED DESCRIPTION OF THE PREFERRED EMBODIMENT

Figure 1:
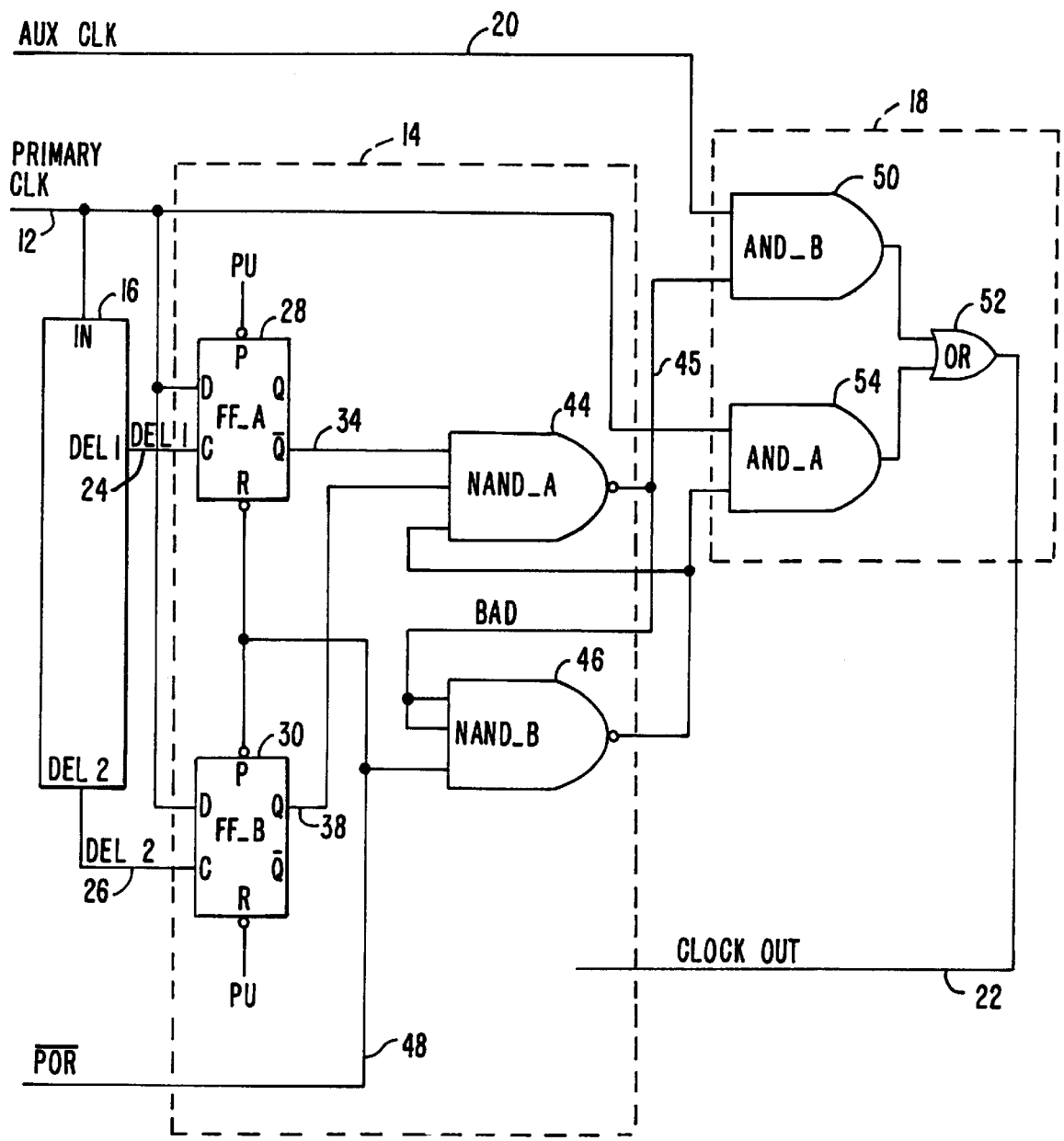
FIG. 1 is a block diagram of a first embodiment of a detection and switching circuit according to the present invention.

FIG. 1 is a diagram of one embodiment of a clock detection and switching circuit according to the present invention. A primary clock to be monitored is provided on an input line 12. The clock is provided to a logic circuit 14, and is also provided to a delay line 16. When logic circuit 14 detects a bad clock signal, it provides an appropriate signal to switching circuit 18, which then switches to an auxiliary clock on a line 20 and provides it to its clock output 22.

Delay line 16 has a first delay output (DEL1) on a line 24, and a second delay output (DEL2) on a line 26. These are provided as clocking inputs to flip-flops 28 and 30, respectively. Both flip-flops have their data input coupled to primary clock input 12.

Figure 3:
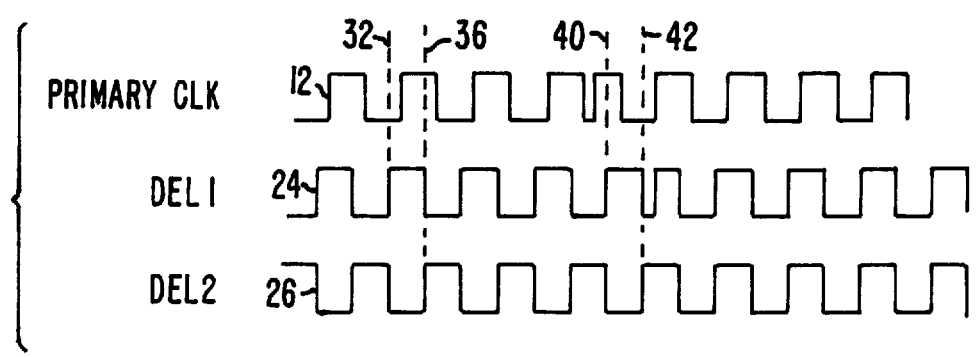
FIG. 3 is a timing diagram illustrating the operation of the circuits of FIGS. 1 or 2.

Referring now to FIG. 3, the operation of the circuit of FIG. 1 can be better understood. FIG. 3 shows the timing for primary clock 12, DEL1 as signal 24, and DEL2 as signal 26. As can be seen by reference point 32, the rising edge of DEL1 coincides with the low portion of the primary clock. Thus, in normal operation, the rising edge should clock through a low data input of flip-flop 28, providing a high level value at the inverting output 34 of flip-flop 28. Since the low clock levels will continuously be provided at each rising edge of DEL1, the inverting output 34 should always be at a high level.

Similarly, it can be seen that DEL2 has a rising edge at a point in time 36 corresponding to a high level of the primary clock. Thus, the non-inverting output 38 of flip-flop 30 should always be high.

One possible error scenario is for the clock to be stuck either at a high level or a low level. If the clock is stuck at a high level, the inverting output of flip-flop 28 will go low, indicating an error. Similarly, if the clock output is stuck at low level, the non-inverting output 38 of flip-flop 30 will transition low, indicating an error.

Other errors can be caused by the pulse width of the clock becoming irregular. Referring again to FIG. 3, at a point in time 40 there is shown a pulse on the primary clock occurring more quickly than it should, with the result that DEL1's rising edge clocks a high level, rather than a low level, thus indicating an error. This concept will work because the DEL1 signal is a delayed signal, and thus should be able to clock with the last good clock signal. Similarly, at a point in time 42, when the clock should normally be high, it is low, thus causing an error to be detected by the rising edge of DEL2.

As is apparent from the timing diagram of FIG. 3, alternate embodiments of the invention are possible. For example, it is possible to use the primary clock signal as the clocking signal, with DEL1 and DEL2 being the data inputs. As can be seen, this will also detect the errors indicated by lines 40 and 42.

Returning to FIG. 1, the power on reset is also connected to the reset inputs of flip-flop 28, and the preset input of flip-flop 30. For flip-flop 30, the preset is selected because the desire is to preset the non-inverting output to a high level, not a low level. The preset input of flip-flop 28, and the reset input of flip-flop 30 are connected to PU, a power-up or power-on-reset signal line.

The rest of logic means 14 consists of two NAND gates, 44 and 46. NAND gate 44 has as its inputs the non-inverting output 38 of flip-flop 30, and the inverting output 34 flip-flop 28. These two signals should normally be high, and if either transitions to a low level, NAND gate 44 will provide a high output level, indicating a bad primary clock. The other input of NAND gate 44 is the output of NAND gate 46, which serves to latch the bad signal level. NAND gate 46 also provides a power on reset signal from power on reset line 48.

As can be seen, the output of NAND gate 44 will select AND gate 50 in switching circuit 18, enabling auxiliary clock 20 to pass through OR gate 52 to clock output 22. At the same time, NAND gate 46 will deselect AND gate 54 which normally provides the primary clock on line 12 through OR gate 52 to output 22.

Figure 2:
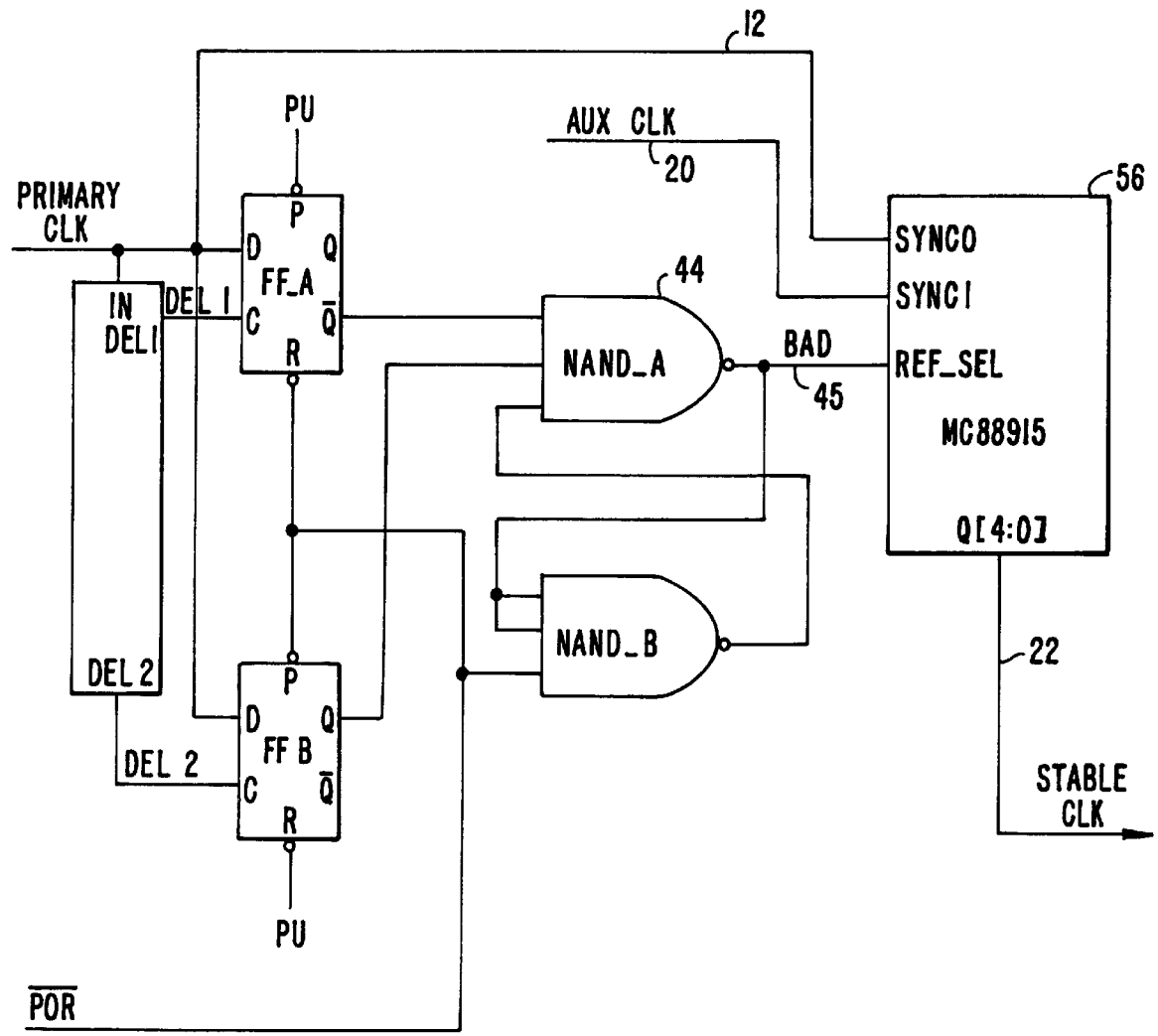
FIG. 2 is a block diagram of an alternate embodiment of the circuit of FIG. 1 incorporating a phase lock loop in the switching circuit.

Switching circuit 18 of FIG. 1 can cause glitches or very short clock cycles depending upon the relative alignment of the primary clock and the auxiliary clock. In order to avoid this, a phase lock loop is preferably incorporated in switching circuit 18. One embodiment of this is shown in FIG. 2, with the phase lock loop being incorporated into a clock driver 56, such as the Motorola MC88915. In this arrangement, the output of NAND gate 44 is connected to a reference select input of driver 56, with the auxiliary and primary clocks being the two clock inputs. Here, the auxiliary clock is connected to a test clock input, using the driver in a different way than what it was intended for. When the reference select input is activated, the driver 56 synchronously switches over from the primary clock to the auxiliary clock using a phase lock loop, to provide an output clock on a line 22.

Figure 4:
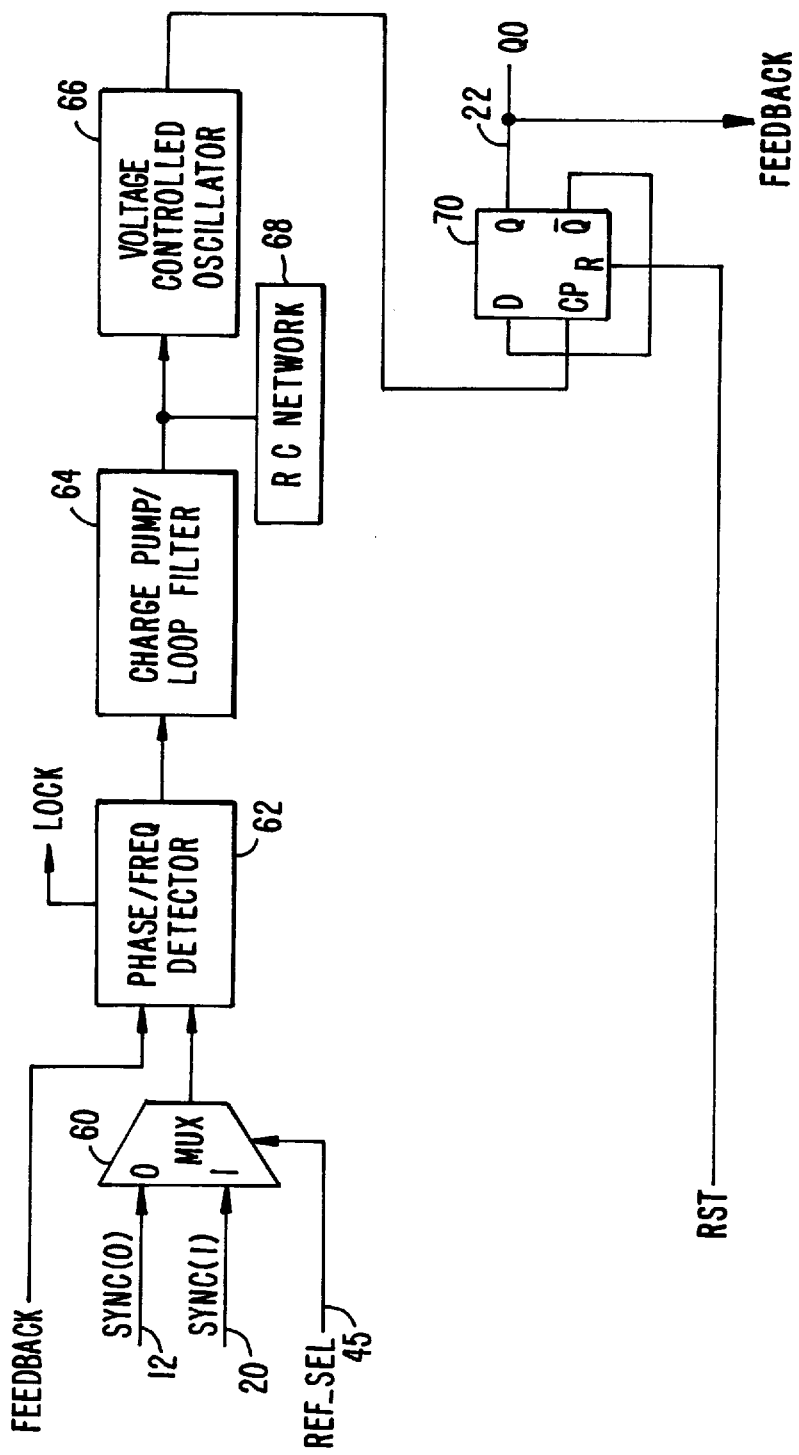
FIG. 4 is a diagram of one embodiment of the switching circuit of FIG. 2.

FIG. 4 illustrates one embodiment of clock driver 56 of FIG. 2, incorporated in the Motorola MC88915. As can be seen, the reference select signal 45 from NAND gate 44 is provided to a multiplexer 60, which selects one of the primary clock on line 12 or the auxiliary clock on line 20. The signal is provided through a phase/frequency detector 62 and then to a charge pump/loop filter 64. The output is then connected to a voltage controlled oscillator 66, and also to an RC network 68. The output of VCO 66 is provided to the clock input of a flip-flop 70, with the non-inverting output being the final clock signal on line 22, which is also provided as a feedback signal to phase/frequency detector 62.

As will be understood by those of skill in the art, the present invention can be embodied in other specific forms without departing from the spirit or essential characteristics thereof. For example, rather than including a second delay output, an inverter could be applied to the first delay signal and used as the data input for a second flip-flop. Additionally, other types of logic to implement the same boolean algebra could be used rather than the NAND gates set forth. Accordingly, the foregoing disclosure is intended to be illustrative of the present invention, but not limiting of the scope of the invention, which is set forth in the following claims.

What is claimed is:

1. A clock failure detection circuit for detecting failure of a first clock and switching to a second clock, comprising:

a delay line having an input coupled to said first clock, and having at least a first delayed output, said first delayed output having a delay that offsets an edge of said first delayed output compared to said first clock;

logic means, having inputs coupled to said first clock and said first delayed output, with one of said inputs being an edge-triggered clock and the other input being a data input, for producing a good output signal when said data input is a first value when clocked, and a bad output signal when said data input is a second value when clocked; and switching means, coupled to said logic means and having said first and second clocks as inputs, for switching from said first clock to said second clock when said bad output signal is received.

2. The circuit of claim 1 wherein said delay line has a second delayed output.

3. The circuit of claim 2 wherein said logic means includes:

a first latch having said first clock as a data input and said first delayed output as a clock input; and a second latch having said first clock as a data input and said second delayed output as a clock input.

4. The circuit of claim 3 wherein said logic means further comprises:

a first NAND gate having a first input coupled to an inverting output of said first latch, and a second input coupled to a non-inverting output of said second latch; and a second NAND gate having a first input coupled to an output of said first NAND gate, a second input coupled to a Power On Reset input line, and an output coupled to a third input of said first NAND gate;

wherein said first NAND gate output provides said good and bad output signals to said switching means.

5. The circuit of claim 1 wherein said switching means includes a phase lock loop for synchronizing the switching from said first clock to said second clock.

6. The circuit of claim 1 wherein said first clock signal is connected to said data input of said logic means and said delayed output is connected to said edge-triggered clock input of said logic means.

7. A clock failure detection circuit for detecting failure of a first clock and switching to a second clock, comprising:

a delay line having an input coupled to said first clock, and having first and second delayed outputs, said first delayed output having a delay that causes a rising edge of said first delayed output to coincide with a low portion of a good first clock signal and said second delayed output having a delay that causes a rising edge of said second delayed output to coincide with a high portion of a good first clock signal;

a first latch having said first clock as a data input and said first delayed output as a clock input;

a second latch having said first clock as a data input and said second delayed output as a clock input;

a first NAND gate having a first input coupled to an inverting output of said first latch, and a second input coupled to a non-inverting output of said second latch;

a second NAND gate having a first input coupled to an output of said first NAND gate, a second input coupled to a Power On Reset input line, and an output coupled to a third input of said first NAND gate;

wherein said first NAND gate output provides a good output signal when said first clock signal is good, and a bad output signal when said first clock signal is bad; and switching means, coupled to said first NAND gate and having said first and second clocks as inputs, for switching from said first clock to said second clock when said bad output signal is received, said switching means including a phase lock loop for synchronizing the switching from said first clock to said second clock.

8. A method for detecting failure of a first clock and switching to a second clock, comprising the steps of:

delaying said first clock to produce at least a first delayed output, said first delayed output having a delay that offsets an edge of said first delayed output compared to said first clock;

producing a good output signal when one of said first and delayed clock signals is a first value at a time of an edge of the other, and producing bad output signal when one of said first and delayed clock signals is a second value at the time of an edge of the other; and switching from said first clock to said second clock when said bad output signal is received.

* * * * *